(12) United States Patent
Namba

(10) Patent No.: US 7,294,996 B2
(45) Date of Patent: Nov. 13, 2007

(54) CHARACTERISTIC EVALUATING SYSTEM AND CHARACTERISTIC EVALUATING METHOD

(75) Inventor: Akihiro Namba, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/511,295

(22) Filed: Aug. 29, 2006

(65) Prior Publication Data

US 2007/0046277 A1    Mar. 1, 2007

(30) Foreign Application Priority Data

Aug. 30, 2005   (JP) .............................. 2005-248712

(51) Int. Cl.
  *G01R 31/02*   (2006.01)
  *G01R 31/28*   (2006.01)
  *G01R 31/08*   (2006.01)

(52) U.S. Cl. ..................... 324/72.5; 324/529; 324/530; 324/522

(58) Field of Classification Search ............... 324/72.5, 324/72, 509, 512, 513, 519, 520, 522, 523, 324/527–530, 76.11, 158.1, 66
See application file for complete search history.

(56) References Cited

U.S. PATENT DOCUMENTS 4,546,309 A * 10/1985 Kang et al. .................. 324/529
5,825,190 A * 10/1998 Van Der Laan et al. ..... 324/627
6,677,829 B2 * 1/2004 Maki et al. ................ 333/22 R
6,741,081 B1 * 5/2004 Eslambolchi et al. ....... 324/541
6,791,479 B2 * 9/2004 Kraus et al. ................... 341/26
2001/0001536 A1  5/2001 Maddala et al.
2005/0232412 A1* 10/2005 Ichihara et al. ............. 379/414

FOREIGN PATENT DOCUMENTS

JP      08-068837      3/1996
JP     2000-147002     5/2000

* cited by examiner

*Primary Examiner*—Vincent Q. Nguyen
*Assistant Examiner*—Hoai-An D. Nguyen
(74) *Attorney, Agent, or Firm*—Antonelli, Terry, Stout & Kraus, LLP.

(57) ABSTRACT

The characteristic evaluating system of the present invention includes: a cable-driving transmitter transmitting a signal to one end of a cable to be measured; a load connected to the other end of the cable; a probe detecting a common mode current of the cable; a receiver receiving a signal detected by the probe; and a controller controlling the cable-driving transmitter, the load, and the receiver. The cable-driving transmitter is constructed such that a plural transmission condition is selectable when transmitting the signal. The load is constructed such that plural termination conditions corresponding to the signals transmitted to the cable is selectable. The characteristic of the cable is measured by scanning relative positions of the probe and the cable in a longitudinal direction of the cable.

11 Claims, 7 Drawing Sheets

US 7,294,996 B2

CHARACTERISTIC EVALUATING SYSTEM AND CHARACTERISTIC EVALUATING METHOD

The present application claims priority from Japanese application JP2005-248712 filed on Aug. 30, 2005, the content of which is hereby incorporated by reference into this application.

BACKGROUND OF THE INVENTION

1. Field of the Invention

The present invention relates to a characteristic evaluating system and a characteristic evaluating method. In particular, it relates to an evaluating system suitable for evaluating EMC performance of cables and an EMC performance evaluating method.

2. Description of the Related Art

In recent years, there has been a growing demand for evaluating EMC (Electro-Magnetic Compatibility) performance of various products.

In order to predict EMI (Electro-Magnetic Interference) generated from a cable, it is necessary to measure a common mode current in the cable or to measure a magnetic field distribution in the vicinity of the cable. Patent Reference 1 discloses a current probe which is operated with high frequency and has little influence on electric characteristics of signals to be measured. Further, Patent Reference 2 discloses an apparatus for measuring a high frequency magnetic field in the vicinity of a cable.

[Patent Reference 1] Japanese Patent Unexamined Publication No. 2000-147002

[Patent Reference 2] Japanese Patent Unexamined Publication No. Hei 8-68837

SUMMARY OF THE INVENTION

However, according to technologies disclosed in patent documents 1 and 2, it is not possible to simulate cable implementations, which differ from product to product, at one time. Therefore, it is necessary to prepare various samples having different terminal load conditions, drive voltages, and cable lengths, and to evaluate EMC performance of each cable as a single unit by measuring the above characteristics.

It is an object of the present invention to provide a characteristic evaluating system and a characteristic evaluating method capable of simulating cable implementations being different from product to product and easily measuring overall EMC performance of cables.

The above object can be achieved by a characteristic evaluating system including a probe, a transmitter, a load, a receiver, and a controller, and a characteristic evaluating method therefor. The probe clamps a cable and measures a current flowing in the cable. The transmitter transmits a signal to one end of the cable and drives the cable. The load is connected to the other end of the cable. The receiver receives a signal from the probe. The controller controls the transmitter, load, and receiver. Further, the controller selectively controls a transmission condition of the transmitter and a termination condition of the load, scans the probe, and measures a characteristic of the cable.

According to the present invention, there is provided an EMC performance evaluating system and an EMC performance evaluating method capable of evaluating EMC performance of cables by a simple operation.

DESCRIPTION OF THE PREFERRED EMBODIMENTS

Figure 1:
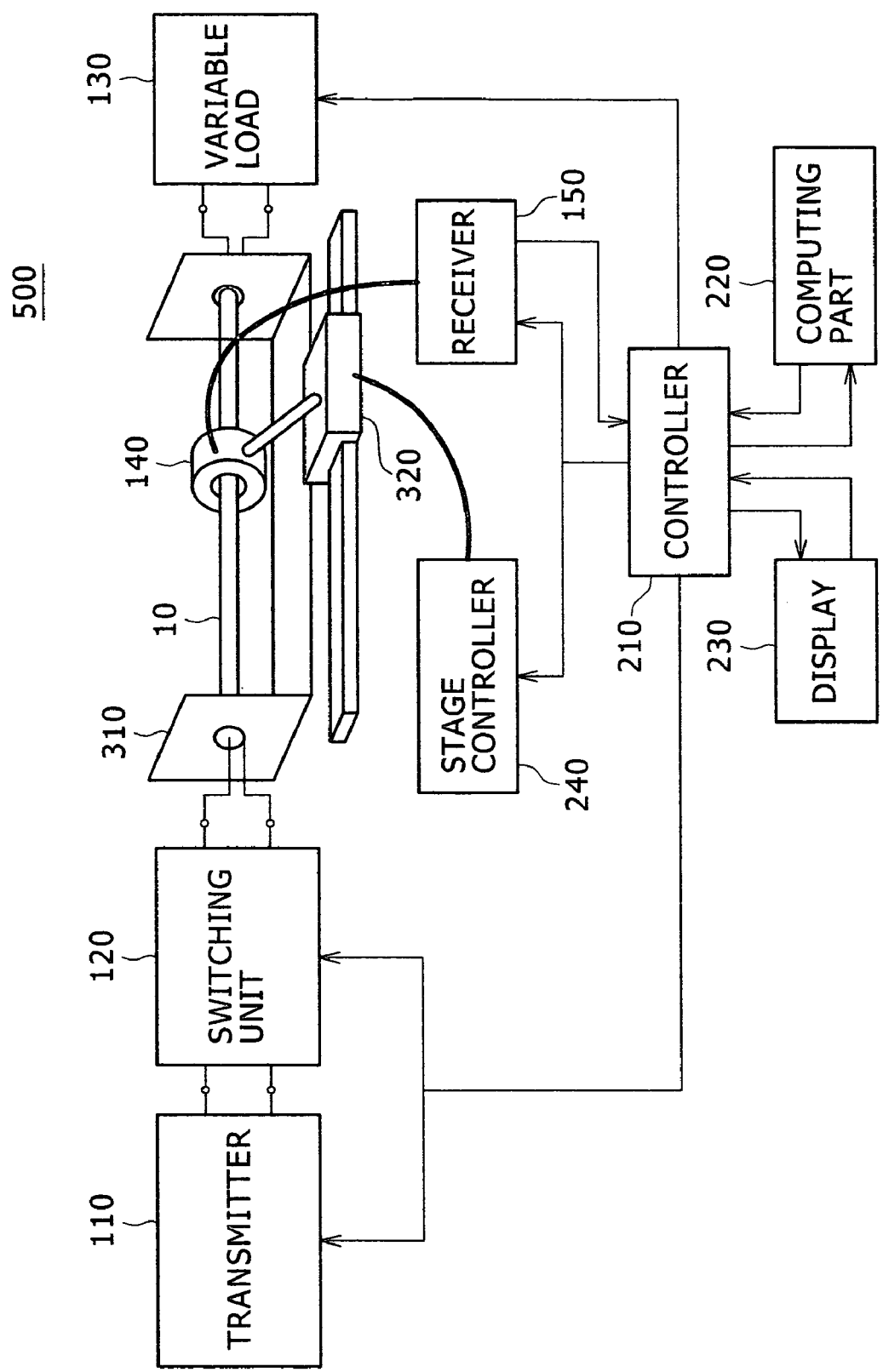
FIG. 1 is a diagram showing the configuration of an EMC performance evaluating system for cables.

Referring now to the accompanying figures, some preferred embodiments of the present invention will be described. FIG. 1 is a diagram showing the configuration of an EMC performance evaluating system for cables. In FIG. 1, a subject cable 10 is fixed to a U-shaped cable fixing jig 310. A current probe 140 which clamps the subject cable is attached to a movable stage 320 being movable in the longitudinal direction of the subject cable. The common mode current flowing in the subject cable 10 is detected by the current probe 140 at each point of the subject cable 10. In this regard, the maximum common mode current detected during the scan in the longitudinal direction of the subject cable 10 is simply called common mode current.

A transmitter 110 and a switching unit 120 controlled by a controller 210 is connected to a transmission end of the subject cable 10, and a signal is applied to the subject cable 10. A variable load 130 controlled by the controller 210 is connected to the other end of the subject cable 10. The current detected by the current probe 140 is measured by a receiver 150 including a spectrum analyzer controlled by the controller 210.

The EMC performance evaluating system 500 has a computing part 220 to compute EMC performance of the cable from the measured current, amplitude of the transmitter 110, a load value of the variable load 130, and route information of the switching unit 120. The EMC performance evaluating system 500 is also equipped with a storage unit (not shown) for storing a result computed by the computing part 220 and a display 230 for displaying the computed result.

The EMC performance evaluating system 500 evaluates EMC performance of the cable by the following operation. Also, although the spectrum analyzer is used as a receiver, a network analyzer may be used in place of the transmitter and receiver. Alternatively, a spectrum analyzer with a built-in tracking generator may be used.

By choosing between the transmitter 110 and the switching unit 120, a signal in an arbitrary driven state is applied to the subject cable 10. Namely, an arbitrary transmission condition is set. Further, an arbitrary termination condition of the cable is set by the variable load 130. The current probe 140 fixed to the movable stage 320 measures an electric current at an arbitrary point of the cable. The signal detected by the current probe is measured by the receiver 150.

The transmitter 110, switching unit 120, variable load 130, stage controller 240, and receiver 150 are all controlled by the controller 210. The stage controller 240 controls the movable stage 320. The receiver 150 transmits the measured signal to the controller 210.

The signals associated with the amplitude of the transmitter 110, route information of the switching unit 120, load value of the variable load 130 and measured by the receiver 150 are processed in the computing part 220 and stored in the storage unit which is a part of the controller 210. Also, the computed result is shown on the display 230.

Further, the controller 210 and the computing part 220 may not be provided separately, and a single central processing unit (CPU) may perform control and computing. Also, a single computer may serve as the controller 210, computing part 220, and display 230. The transmitter 110 and switching unit 120 are altogether called cable-driving transmitter. The cable-driving transmitter may simply be called transmitter. Although the stage controller 240 moves the probe 140, the cable fixing jig 310 may be fixed to the movable stage 320 and the cable 10 may be moved.

The subject cables 10 which can be measured by the evaluating system shown in FIG. 1 are coaxial cables, parallel two-wire cables, twisted pair cables, flat cables, and multicore cables. Each of them can be measured whether it has a screening shield or not.

Figure 2:
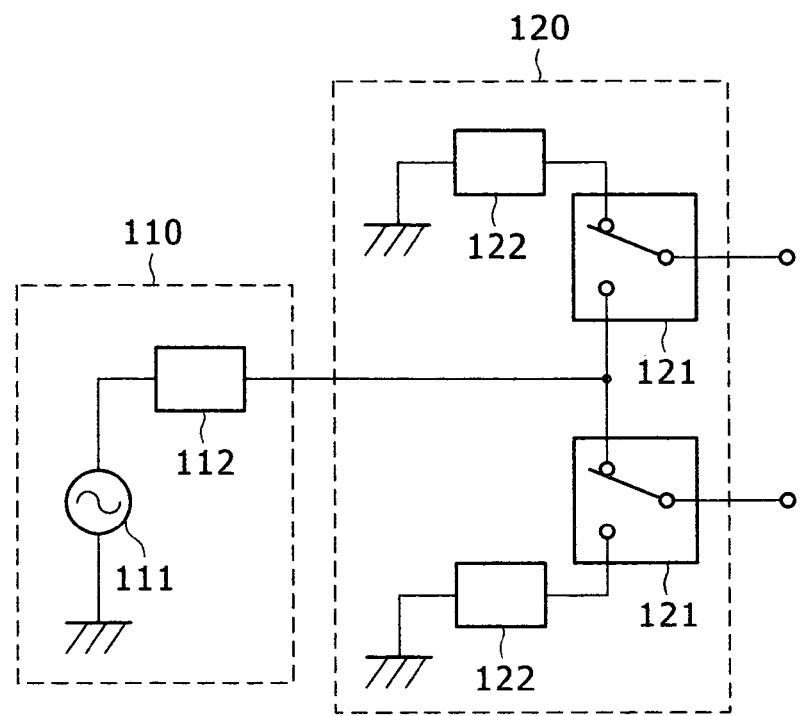
FIG. 2 is a circuit diagram wherein a single end voltage is applied to one signal line of a differential cable.
Figure 3:
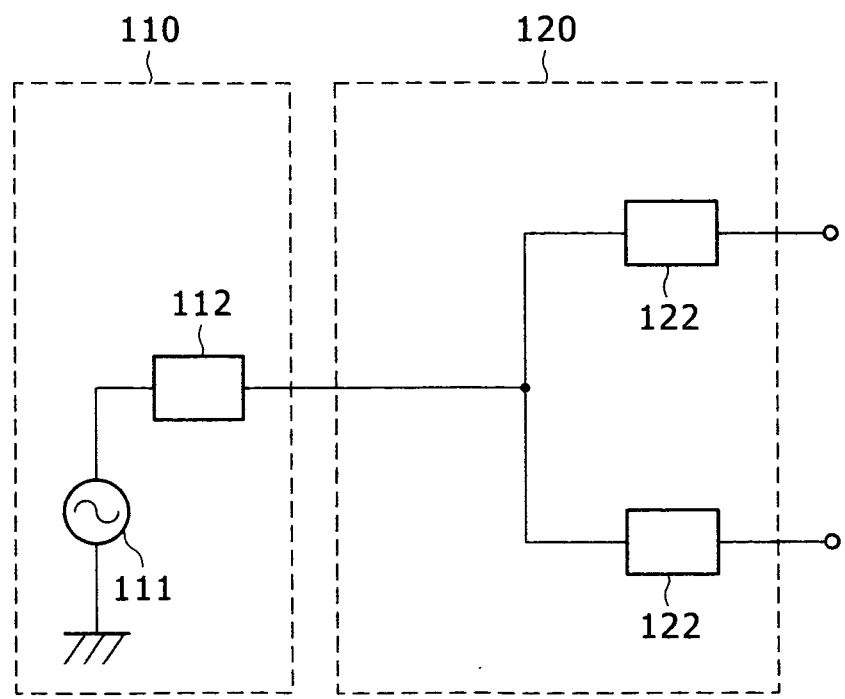
FIG. 3 is a circuit diagram wherein a common mode voltage is applied to the differential cable.
Figure 4:
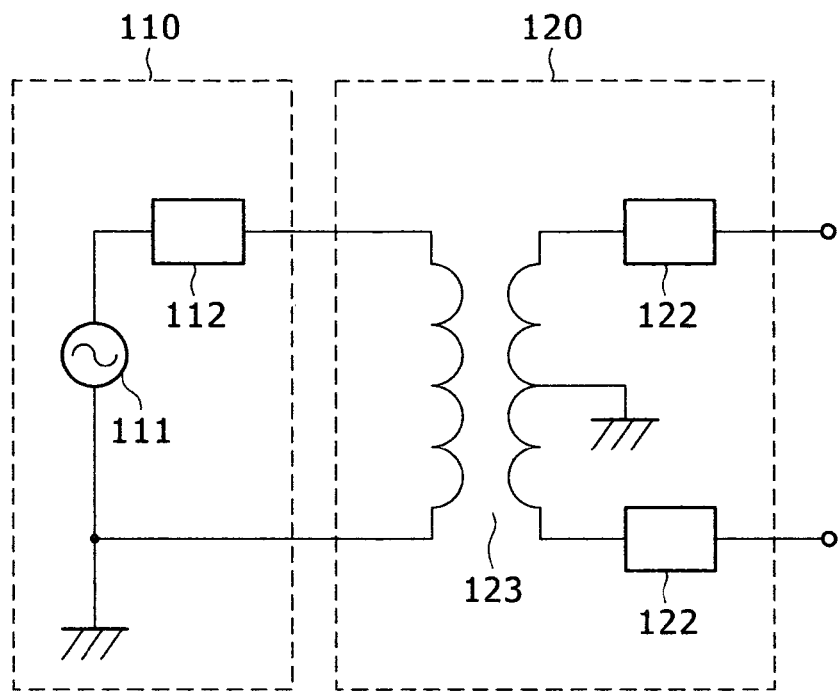
FIG. 4 is a circuit diagram wherein a differential mode voltage is applied to the differential cable by using a transformer.
Figure 5:
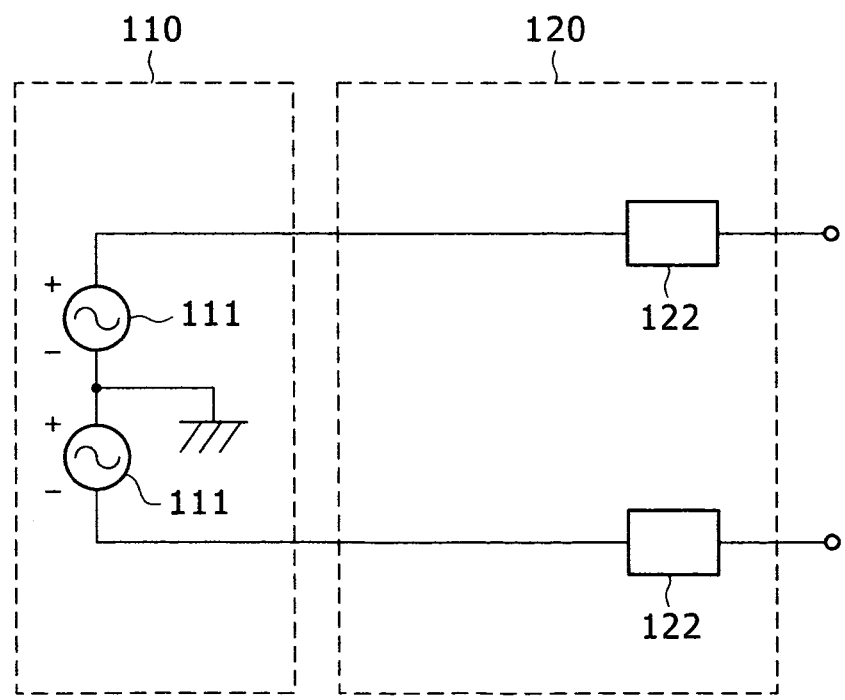
FIG. 5 is a circuit diagram wherein a differential mode voltage is applied to the differential cable by using a differential driver.

Referring to FIGS. 2 to 5, the configuration of the transmitter 110 and switching unit 120 will be described. In this regard, FIG. 2 is a circuit diagram wherein a single end voltage is applied to one signal line of a differential cable. FIG. 3 is a circuit diagram wherein a common mode voltage is applied to the differential cable. FIG. 4 is a circuit diagram wherein a differential mode voltage is applied to the differential cable by using a transformer. FIG. 5 is a circuit diagram wherein a differential mode voltage is applied to the differential cable by using a differential driver.

In FIG. 2, the transmitter 110 includes a voltage source 111 and a drive source impedance 112. The switching unit 120 includes two switches 121 being operated in cooperation and two matching impedances 122. By choosing between two switches 122 alternately in cooperation, the switching unit 120 connects one signal line of the differential cable with the transmitter 110 and applies a signal. The other signal line is connected to the matching impedance 112. A signal is applied independently to each of the two signal lines of the differential cable and each common mode current is measured. The EMC performance evaluating system 500 can compute common mode currents flowing in the cable during the differential mode drive and common mode drive by performing addition and subtraction on two obtained common mode currents in the computing part 230. When signals are inputted to both the signal lines of the cable at a time, it is difficult to observe common mode currents. The EMC performance evaluating system 500, however, computes a common mode current during the common mode drive (the current flowing in the signal line is in the same direction) by applying a signal separately and by addition. On the other hand, the common mode current during the differential drive (the current flowing in the signal line is in the reverse direction) is obtained by subtraction.

In FIG. 3, the transmitter 110 includes a voltage source 111 and a drive source impedance 112. The switching unit 120 includes two matching impedances 122, and the two matching impedances 122 are both connected to the transmitter 110. If the configuration shown in FIG. 3 is applied to the EMC performance evaluating system 500, the common mode current during the common mode drive can be measured.

In FIG. 4, the transmitter 110 includes a voltage source 111 and a drive source impedance 112. The switching unit 120 includes a transformer 123, whose middle point tap on the secondary side is grounded, and two matching impedances 122. The single end voltage is converted to a differential mode voltage by the transformer 123.

In FIG. 5, a differential driver is formed by two voltage sources 111 in the transmitter 110. The switching unit 120 includes two matching impedances 122. The two matching impedances 122 are connected to the voltage sources 111, respectively. If the configuration shown in FIG. 4 or FIG. 5 is applied to the EMC performance evaluating system 500, the common mode current during the differential mode drive can be measured.

If the matching impedance 122 used in FIG. 2 to FIG. 5 includes a parameter variable element, an arbitrary driving condition can easily be achieved. Further, although the switching unit 120 in FIG. 3 to FIG. 5 does not perform switching operation, it is a switching unit in a broad sense.

Figure 6:
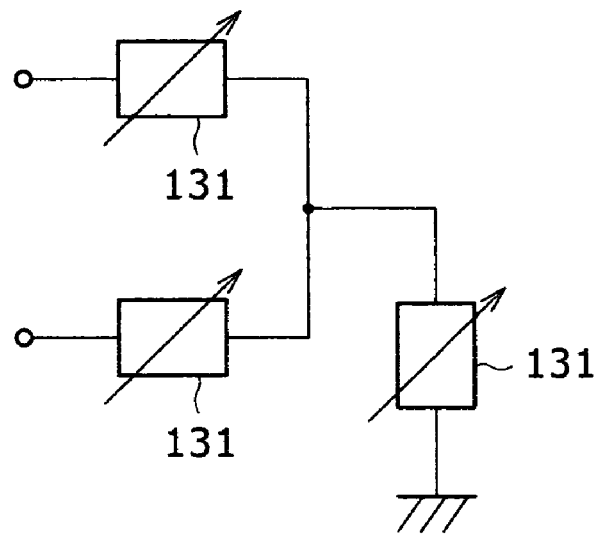
FIG. 6 shows a T-type load circuit of variable resistance.
Figure 7:
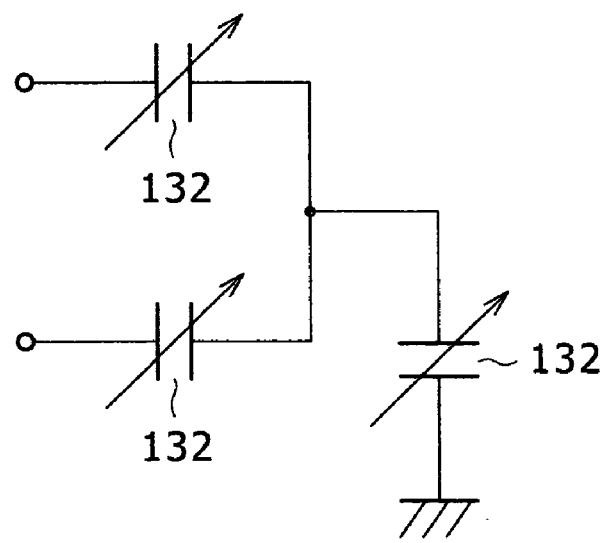
FIG. 7 shows a T-type load circuit of variable capacitance.
Figure 8:
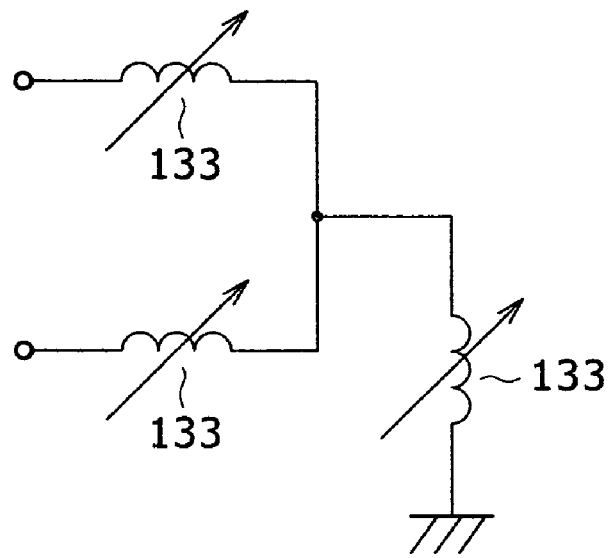
FIG. 8 shows a T-type load circuit of variable inductance.
Figure 9:
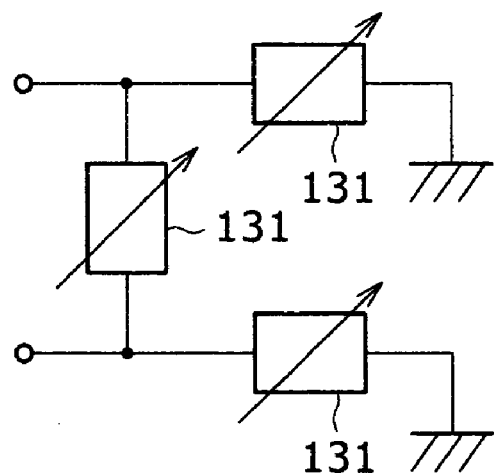
FIG. 9 shows a π-type load circuit of variable resistance.
Figure 10:
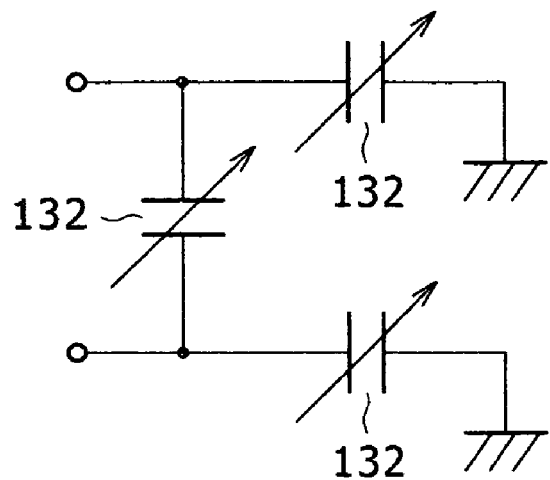
FIG. 10 shows a π-type load circuit of variable capacitance.
Figure 11:
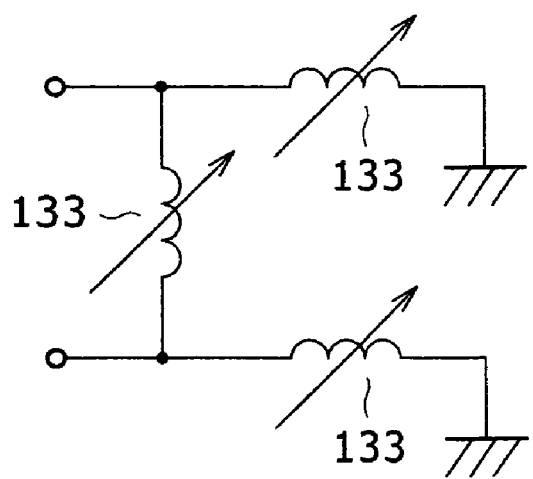
FIG. 11 shows a π-type load circuit of variable inductance.

Now, referring to FIGS. 6 to 11, the configuration of the variable load 130 will be described. In this regard, FIG. 6 shows a T-type load circuit of variable resistance. FIG. 7 shows a T-type load circuit of variable capacitance. FIG. 8 shows a T-type load circuit of variable inductance. Further, FIG. 9 shows a π-type load circuit of variable resistance. FIG. 10 shows a π-type load circuit of variable capacitance. FIG. 11 shows a π-type load circuit of variable inductance.

The load circuit of the variable resistance in FIGS. 6 and 9 is the most commonly used load circuit capable of matching termination. Although the load circuit of the variable capacitance shown in FIGS. 7 and 10 is non-matching, it is a load circuit wherein a CMOS-type receiver may be used and, also, the use of the variable inductance load shown in FIGS. 8 and 11 may be considered.

It is possible to provide an arbitrary loaded state by changing the characteristic value of the parameter variable element in FIGS. 6 to 11. Further, the variable load may be formed by combining the constructions shown in FIGS. 6 to 11.

Figure 12:
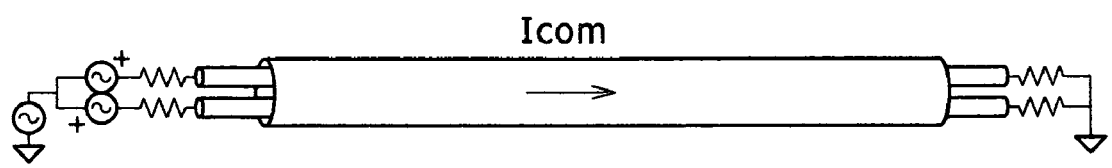
FIG. 12 illustrates a common mode current flowing in the cable wherein there exist both differential driving components and common mode driving components.
Figure 13:
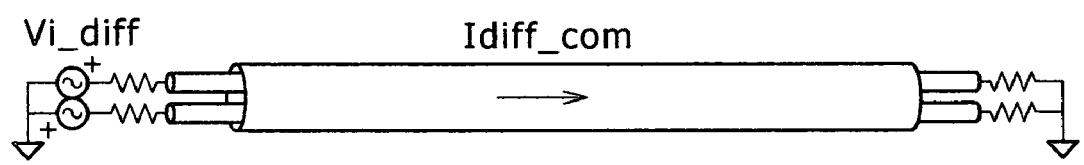
FIG. 13 illustrates a common mode current flowing in the cable during the differential mode drive.
Figure 14:
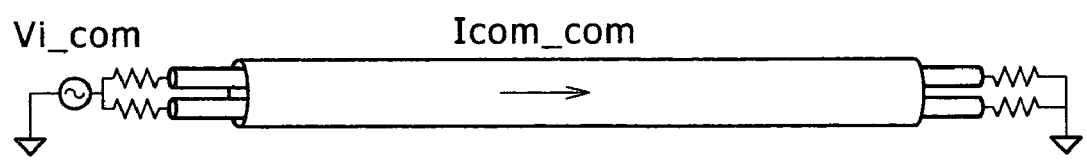
FIG. 14 illustrates a common mode current flowing in the cable during the common mode drive.

Referring to FIGS. 12 to 14, EMC performance of the cable will be defined. In this regard, FIG. 12 illustrates a common mode current flowing in the cable wherein there exist both the differential driving components and common mode driving components. FIG. 13 illustrates a common mode current flowing in the cable during the differential mode drive. Also, FIG. 14 illustrates a common mode current flowing in the cable during the common mode drive.

The ordinary common mode current shown in FIG. 12 is the sum of a common mode current made up of differential driving components and a common mode current made up of common mode driving components. However, when there exist both the common mode current made up of differential driving components and common mode current made up of common mode driving components, it is difficult to handle them. Therefore, as shown in FIG. 13 and FIG. 14, respectively, the current made up of differential driving components alone and the current made up of common mode driving components alone are separated.

In FIG. 13, an amplitude of the drive voltage is shown as Vi_diff and an amplitude of the common mode current during the differential drive is shown as I diff_com. In this regard, the coefficient Ydc of conversion from the differential drive voltage to the common mode current is defined by use of the expression (1) below:

$$Ydc = I\,diff\_com / Vi\_diff \quad (1)$$

The conversion coefficient Ydc can be used as a first parameter for evaluating EMC performance of the cable.

On the other hand, in FIG. 14, an amplitude of the drive voltage is shown as Vi_com and an amplitude of the common mode current during the common-mode drive is shown as I com_com. In this regard, the coefficient Ycc of conversion from the common mode drive voltage to the common mode current is defined by use of the expression (2) below:

$$Ycc = I\,com\_com / Vi\_com \quad (2)$$

The conversion coefficient Ycc can be used as a second parameter for evaluating EMC performance of the cable.

The EMC performance evaluating system 500 computes the above evaluation parameters Ydc and Ycc in the computing part 220. FIGS. 13 and 14 show results of the cases wherein mode separation is performed in the embodiment of FIG. 12. Therefore, the coefficient of conversion from the drive voltage on an arbitrary drive condition to the common mode current can be expressed by linear combination of Ydc and Ycc. Thus, by evaluating Ydc and Ycc, the common mode conversion coefficient, or the EMC performance, of the cable can be expressed.

The EMC performance evaluating system 500 for cables applies differential drive and common mode drive to a cable to be evaluated, computes Ydc and Ycc in the computing part 220, stores the computed result in the controller 210, and shows the result on the display 230.

According to the present embodiment, there is provided an EMC performance evaluating system capable of evaluating EMC performance of cables by a simple operation. Further, an EMC performance evaluating method for the cable can be provided through evaluating Ydc and Ycc.

Although the maximum common mode current during the scan in the longitudinal direction of the cable is called common mode current, the evaluation may be performed by using an average common mode current during the scan or by using a half value of the maximum common mode current, and the value which may be used is not limited to the above.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as the encompassed by the scope of the appended claims.

What is claimed is:

1. A characteristic evaluating system comprising:
   a probe clamping a cable and measuring a current flowing in said cable;
   a cable-driving transmitter transmitting a signal to one end of said cable and driving said cable;
   a load connected to the other end of said cable;
   a receiver receiving a signal from said probe; and
   a controller controlling said cable-driving transmitter, said load, and said receiver,
   the characteristic evaluating system scanning said probe or said cable and measuring a characteristic of said cable,
   wherein said cable-driving transmitter is constructed such that a plurality of transmission conditions are selectable; and
   said load is constructed such that a plurality of termination conditions are selectable.

2. The characteristic evaluating system according to claim 1, wherein said cable-driving transmitter comprises a transmitter and a switching unit.

3. The characteristic evaluating system according to claim 1, wherein said load comprises a variable load.

4. The characteristic evaluating system according to claim 1, wherein said characteristic is a common mode current.

5. The characteristic evaluating system according to claim 4, wherein the maximum common mode current in a scanning range of said cable is regarded as said characteristic of said cable.

6. The characteristic evaluating system according to any one of claim 1, wherein said cable-driving transmitter and said receiver comprise a network analyzer or a spectrum analyzer with a tracking generator.

7. The characteristic evaluating system according to any one of claim 2, wherein said cable-driving transmitter and said receiver comprise a network analyzer or a spectrum analyzer with a tracking generator.

8. The characteristic evaluating system according to any one of claim 3, wherein said cable-driving transmitter and said receiver comprise a network analyzer or a spectrum analyzer with a tracking generator.

9. The characteristic evaluating system according to any one of claim 4, wherein said cable-driving transmitter and said receiver comprise a network analyzer or a spectrum analyzer with a tracking generator.

10. A characteristic evaluating method comprising the steps of:
    setting a termination condition of a cable;
    setting a transmission condition of said cable;
    driving said cable;
    measuring a plurality of common mode currents corresponding to positions of said driven cable; and
    obtaining a common mode current to be evaluated from said plurality of common mode currents and displaying it.

11. The characteristic evaluating method according to claim 10, wherein said common mode current to be evaluated is the maximum value of said plurality of common mode currents.

* * * * *